US008855337B2

(12) United States Patent
van Lippen et al.

(10) Patent No.: US 8,855,337 B2
(45) Date of Patent: Oct. 7, 2014

(54) MICROPHONE AND ACCELEROMETER

(75) Inventors: Twan van Lippen, Bladel (NL); Geert Langereis, Eindhoven (NL); Martijn Goossens, Veldhoven (NL)

(73) Assignee: NXP, B.V., Eindhoven (NL)

( * ) Notice: Subject to any disclaimer, the term of this patent is extended or adjusted under 35 U.S.C. 154(b) by 510 days.

(21) Appl. No.: 13/255,048

(22) PCT Filed: Feb. 3, 2010

(86) PCT No.: PCT/IB2010/050505
§ 371 (c)(1),
(2), (4) Date: Oct. 26, 2011

(87) PCT Pub. No.: WO2010/103410
PCT Pub. Date: Sep. 16, 2010

(65) Prior Publication Data
US 2012/0033832 A1   Feb. 9, 2012

(30) Foreign Application Priority Data
Mar. 9, 2009  (EP) .................................. 09154611

(51) Int. Cl.
*H04R 19/00* (2006.01)
*H01L 21/02* (2006.01)
*H04R 1/24* (2006.01)
*B81C 1/00* (2006.01)

(52) U.S. Cl.
CPC .............. *H04R 19/005* (2013.01); *H04R 1/245* (2013.01); *B81C 1/00182* (2013.01); *H04R 2499/11* (2013.01); *B81B 2201/0235* (2013.01); *B81B 2201/0257* (2013.01)
USPC .............. 381/175; 381/174; 438/53; 257/416

(58) Field of Classification Search
USPC ...................... 379/433.03; 381/369, 174, 175; 257/416–420; 438/50, 53
See application file for complete search history.

(56) References Cited

U.S. PATENT DOCUMENTS 6,168,906 B1  1/2001  Bernstein et al.
7,023,066 B2  4/2006  Lee et al.
(Continued)

FOREIGN PATENT DOCUMENTS

CN    1573725 A    2/2005
CN    1651333 A    8/2005
(Continued)

OTHER PUBLICATIONS

Neumann, J. Jr. et al. "CMOS-MEMS Membrane for Audio-Frequency Acoustic Actuation", Sensors and Actuators A 95, pp. 175-182 (2002).
(Continued)

*Primary Examiner* — Tuan D Nguyen

(57) ABSTRACT

The invention relates to a method for manufacturing a micromachined microphone and an accelerometer from a wafer 1 having a first layer 2, the method comprising the steps of dividing the first layer 2 into a microphone layer 5 and into an accelerometer layer 6, covering a front side of the microphone layer 5 and a front side of the accelerometer layer 6 with a continuous second layer 7, covering the second layer 7 with a third layer 8, forming a plurality of trenches 9 in the third layer 8, removing a part 10 of the wafer 1 below a back side of the microphone layer 5, forming at least two wafer trenches 11 in the wafer 1 below a back side of the accelerometer layer 6, and removing a part 12, 13 of the second layer 7 through the plurality of trenches 9 formed in the third layer 8. The micromachined microphone and the accelerometer according to the invention is advantageous over prior art as it allows for body noise cancellation in order to minimize structure borne sound.

15 Claims, 2 Drawing Sheets

(56) References Cited

U.S. PATENT DOCUMENTS

| | | | |
|---|---|---|---|
| RE40,781 E * | 6/2009 | Johannsen et al. | 381/174 |
| 2003/0161484 A1 | 8/2003 | Kanamori et al. | |
| 2004/0259536 A1 | 12/2004 | Keskar et al. | |
| 2006/0227984 A1 | 10/2006 | Sinclair | |
| 2006/0237806 A1 | 10/2006 | Martin et al. | |
| 2007/0278601 A1 * | 12/2007 | Goodelle et al. | 257/416 |
| 2008/0165022 A1 | 7/2008 | Herz et al. | |
| 2008/0187154 A1 * | 8/2008 | Martin | 381/174 |

FOREIGN PATENT DOCUMENTS

| | | |
|---|---|---|
| EP | 2 237 571 A1 | 10/2010 |
| EP | 2 239 961 A1 | 10/2010 |
| EP | 2 244 490 A1 | 10/2010 |
| WO | 01/14248 A2 | 3/2001 |
| WO | 2006/116017 A2 | 11/2006 |
| WO | 2007/010421 A2 | 1/2007 |
| WO | 2007/024958 A2 | 3/2007 |
| WO | 2010/113107 A1 | 10/2010 |
| WO | 2010/116324 A1 | 10/2010 |
| WO | 2010/122487 A1 | 10/2010 |

OTHER PUBLICATIONS

Silva, J. et al. "Coupled Microphone-Accelerometer Sensor Pair for Dynamic Noise Reduction in MMG Signal Recording", Electronics Letters, vol. 39 No. 21, 2 pgs. (Oct. 2003).

International Search Report and Written Opinion for Int'l. Appln. No. PCT/IB2010/050505 (May 25, 2010)xxx.

Office Action from counterpart application No. 201080010998.3 (Oct. 9, 2013).

Bourne, Marlene; "The Top Ten Reasons for Using MEMS in Cell Phones"; In-Stat/MDR; 10 pages (Sep. 2003).

* cited by examiner

MICROPHONE AND ACCELEROMETER

FIELD OF THE INVENTION

The present invention relates to a method for manufacturing a micromachined microphone and an accelerometer from a wafer and to an apparatus comprising a wafer.

BACKGROUND OF THE INVENTION

A capacitive microphone typically comprises a membrane and a back plate, wherein an air gap is provided between the membrane and the back plate. Sound pressure waves applied onto the membrane force the membrane to vibrate due to a pressure difference over the membrane. In order to obtain a good omni-directional performance, the back side of the membrane is often acoustically isolated. Further, the membrane is usually connected to an acoustically closed back chamber influencing the membrane compliance and defining a lower cut of frequency. A tiny hole in the back chamber is required to compensate for slow changes in atmospheric pressure.

A modulation of the air gap between the membrane and the back plate due to sound pressure waves applied on the membrane result in an electrically detectable signal when using conductive materials for the membrane and the back plate. In this way, the membrane and the back plate, both provided with conductive surfaces, form a capacitor which capacity changes in relation to sound pressure waves applied to the membrane. Ideally, the back plate is a stiff plate and only the membrane is displaced by the sound pressure waves.

Such capacitive microphones known from the prior art often contain a membrane and a back plate that are made in a silicon Micro-Electro-Mechanical System (MEMS) process, while the back chamber is defined by the overall package or the capacitive microphone itself. So-called MEMS microphones are preferably used for mobile phones by integrating electronics with microphones into system in package (SiP) solutions, as conventional electret microphones do not have the desired form factor. The electronics in the microphone may comprise pre-amplifiers, biasing circuits, A/D converters, and signal processing and bus drivers.

The sensitivity of the microphone is determined by the compliance of the membrane, i.e. the flexibility of the membrane. The compliance is controlled by either the mechanical construction or the material parameters (after-fabrication stress and/or Young's modulus), wherein, depending on the design of the microphone, the mechanical construction or the material parameters dominate the performance.

An important performance parameter of such a microphone is the sensitivity to structural born sound, which is governed by undesired relative movement between the membrane and the back plate due to mechanical vibrations acting on the microphone as a whole. The so-called body noise is a disturbing effect of the microphone. One example of such disturbing effect is cross talk of a mobile phone's own speaker into the microphone which has a non-linear transfer function. Such disturbing effects cannot be compensated for by signal processing.

Another problem that most mobile phone users have to deal with is the need to suppress as quickly as possible the ring tone of a phone because they have received a call at a moment that the ring tone sound is highly undesirable (e.g. when in company of others, during a show or other type of performance, during presentations and conferences, in libraries, courts, etc). The user needs to find the phone, retrieve it from his or her pocket or bag, and find the right button (sometimes in the dark or as inconspicuously as possible). This takes time and can irritate the surrounding people.

Accordingly, it is the object of the invention to provide a microphone, which is less sensitive to mechanical vibrations and to provide a method for manufacturing a microphone that provides body noise cancellation.

This object is addressed by a method for manufacturing a micromachined microphone and accelerometer from a wafer having a first layer, the method comprising the steps of dividing the first layer into a microphone layer and into an accelerometer layer, covering a front side of the microphone layer and a front side of the accelerometer layer with a continuous second layer, covering the second layer with a third layer, forming a plurality of trenches in the third layer, removing a part of the wafer below a back side of the microphone layer, forming at least two wafer trenches in the wafer below a back side of the accelerometer layer, and removing a part of the second layer through the plurality of trenches formed in the third layer.

Accordingly, it is an essential idea of the invention to provide an accelerometer, which is preferably provided as a one-dimensional accelerometer, in close vicinity to the microphone, wherein the accelerometer is processed in the same die with the microphone. Such a microphone and accelerometer according to the invention allow for suppressing mechanical vibrations, leading to an improved signal to noise ratio. The accelerometer may facilitate further functionality when used in a cell phone, such as ending a conversation by shaking the cell phone, enabling silent mode when placing the cell phone at its back or front.

Preferably, the microphone is provided as a MEMS capacitive microphone. It is a further advantage of the invention that such an accelerometer can be produced by the same process flow as required for a capacitive MEMS microphone, without changing the physical size of the MEMS microphone die. Doing so, local process variations, which may influence critical parameters for sensitivity, such as stress of a layer, are optimized and no additional masks are necessary for the realisation of the accompanying one-dimensional accelerometer. It is further preferred that the first layer is provided as silicon layer, the second layer is provided as an oxide layer and the third layer is provided as a polysilicon layer.

The micro machined microphone and accelerometer according to the invention can be manufactured using techniques known from the prior art, such as etching using a reactive ion edge, deep reactive ion edging (DRIE), or alternatively wet anisotropic edging in potassium hydroxide (KOH) or tetramethylammonium hydroxide (TMAH), or sacrificial layer edging. Preferably, the second layer is provided as tetra alcoxysilan (TEOS).

According to another preferred embodiment of the invention, the trench in the third layer covering the intersection between the microphone layer and the accelerometer layer via the second layer is wider than the trenches in the third layer covering the microphone layer and/or the accelerometer layer via the second layer. This means that the microphone layer, which preferably forms a microphone membrane, is covered by the third layer, comprising a plurality of trenches, and that the accelerometer layer, which preferably forms an accelerometer membrane, is covered by the third layer comprising a plurality of trenches, and wherein the third layer is preferably removed in the area relatively covering the intersection between the microphone layer and the accelerometer layer.

According to another preferred embodiment of the invention, the at least two wafer trenches in the wafer below the back side of the accelerometer layer form an accelerometer wafer mass, which is defined by the outmost trench on the one side of the wafer below the back side of the accelerometer layer and by the outmost trench on the other side of the wafer below the back side of the accelerometer layer.

According to another preferred embodiment of the invention, the product of the mass of the microphone layer with the compliance of the microphone layer equals the product of the mass of the accelerometer layer and the accelerometer wafer mass with the compliance of the accelerometer layer. In other words, the microphone layer and the accelerometer layer including the accelerometer wafer mass are preferably designed in such a manner that they provide a co-phased response of equal amplitude for mechanical vibrations. This means further, that the accelerometer layer forming the accelerometer is preferably more sensitive to accelerations and less sensitive to sound pressure waves, due to the additional accelerometer wafer mass. It should be noted that the compliance is defined as the reciprocal of the stiffness of the membrane, i.e. the reciprocal of the stiffness of the microphone layer or the reciprocal of the stiffness of the accelerometer layer, respectively.

According to another preferred embodiment of the invention, the first layer is the device layer of a silicon-on-insulator (SOI) wafer. As known in the prior art, a SOI wafer preferably includes a top silicon layer, usually called the device layer, an intermediate insulator (oxide) layer, and a bottom silicon layer that is typically much thicker than the top silicon layer (approximately 650 microns). Alternatively, the first silicon layer can be provided as a silicon wafer.

The object of the invention is further addressed by an apparatus comprising a wafer having a first layer, wherein the first layer is divided into a microphone layer and into an accelerometer layer, and wherein a part of the wafer below a back side of the microphone layer is removed and at least two wafer trenches are formed in the wafer below a back side of the accelerometer layer, and a front side of the microphone layer and a front side of the accelerometer layer are covered with a continuous second layer, wherein the continuous second layer is covered with a third layer, wherein a plurality of trenches are formed in the third layer and wherein a part of the second layer is removed through the plurality of trenches formed in the third layer. This is advantageous over the prior art as the apparatus according to the invention allows for body noise cancellation in order to minimize structure borne sound.

In other words, such an apparatus according to the invention comprises a microphone, provided by the microphone layer forming a membrane and by the trenched second layer forming a back plate, and an accelerator provided by the accelerometer layer forming an accelerometer membrane and by the trenched continuous second layer forming a back plate. It is preferred that the first layer is provided as silicon layer, the second layer is provided as an oxide layer and the third layer is provided as a polysilicon layer.

According to another preferred embodiment of the invention, the microphone layer of the apparatus is adapted for generating a first electrical signal, wherein the first electrical signal is proportional to pressure applied to the microphone layer and/or to the accelerometer layer, and wherein the accelerometer layer is adapted for generating a second electrical signal, wherein the second electrical signal is proportional to pressure applied to the microphone layer and/or to the accelerometer layer. Preferably, the first electrical signal is generated due to a modulation of an air gap between the microphone layer and the trenched third layer forming a first capacitor and the second electrical signal is generated due to a modulation of the air gap between accelerometer layer and the trenched third layer forming a second conductor.

According to another preferred embodiment of the invention, the apparatus comprises a subtraction module which is adapted for subtracting the second signal from the first signal. This is advantageous, as the second electrical signal generated by the second conductor formed by the microphone layer representing structure borne sound due to undesired mechanical vibrations is subtracted from the first electrical signal generated by the first conductor of the microphone layer represent as a result of the subtraction an acoustic signal free of or nearly free of structure borne sound.

According to another preferred embodiment of the invention, the trench in the third layer covering the intersection between the microphone layer and the accelerometer layer via the second layer is wider than the trenches in the third layer covering the microphone layer and/or the accelerometer layer via the second layer. It is further preferred, and according to another preferred embodiment of the invention, that the at least two wafer trenches in the wafer below the back side of the accelerometer layer form an accelerometer wafer mass, which is defined by the outmost trench on the one side of the wafer below the back side of the accelerometer layer and by the outmost trench on the other side of the wafer below the back side of the accelerometer layer. According to another preferred embodiment of the invention, the product of the mass of the microphone layer with the compliance of the microphone layer equals the product of the mass of the of the accelerometer layer and the accelerometer wafer mass with the compliance of the accelerometer layer. It is further preferred that the first layer is a device layer of a SOI wafer.

The object of the invention is further addressed by a method of use of a micromachined microphone and accelerometer according to the invention for detecting a first electrical signal between the microphone layer and the third layer relatively covering the microphone layer, wherein the first electrical signal is proportional to pressure applied to the microphone layer and/or to the accelerometer layer, detecting a second electrical signal between the accelerometer layer and the third layer relatively covering the accelerometer layer, wherein the second electrical signal is proportional to pressure applied to the microphone layer and/or to the accelerometer layer, and subtracting the second electrical signal from the first electrical signal. This is advantageous over prior art, as the signal subtraction removes structure borne sound due to undesired mechanical vibrations in the acoustic signal.

The present invention also includes a method of use of an apparatus having a micro machined microphone and accelerometer:

detecting at least one jolt applied to the telephone, and executing one action comprising any of silencing the phone, suppressing a ring tone, suppressing sound only, setting phone in quiet mode, answering call automatically.

These and other aspects of the invention will be apparent from and elucidated with reference to the embodiments described hereinafter.

DETAILED DESCRIPTION OF THE DRAWINGS

Figure 1A:
FIGS. 1a-1g show an exemplary process of forming a micromachined microphone according to a preferred embodiment of the invention.

In the following detailed description of the preferred embodiments, reference is made to the accompanying drawings, which form a part hereof, and within which are shown by way of illustration specific embodiments by which the invention may be practiced. The drawings described are only schematic and are non-limiting. In the drawings, the size of some of the elements may be exaggerated and not drawn on scale for illustrative purposes. Those skilled in the art will recognize that other embodiments may be utilized and structural changes may be made without departing from the scope of the invention.

Optimum frequency and sensitivity matching can be obtained by making the mass compliance product equal for both the accelerometer and the microphone. Following tables summarizes the properties of both devices. Sensitivities are for frequencies well below the resonance frequencies.

|  | Response to sound/pressure | Response to accelerations |
|---|---|---|
| Microphone | Sensitivity: $\dfrac{\Delta x}{p} = \dfrac{a_d^2 C_d}{\beta}$ | Sensitivity: $\dfrac{\Delta x}{a} = C_d L_d$ |
|  | Resonance: $f_{res} = \dfrac{1}{2\pi \sqrt{C_d L_d}}$ | Resonance: $f_{res} = \dfrac{1}{2\pi \sqrt{C_d L_d}}$ |
| Accelerometer | Sensitivity: $\dfrac{\Delta x}{p} = \dfrac{a_d^2 C_{d\_acc}}{\beta}$ | Sensitivity: $\dfrac{\Delta x}{a} = C_{d\_acc} L_{d\_acc}$ |
|  | Resonance: $f_{res} = \dfrac{1}{2\pi \sqrt{C_{d\_acc} L_{d\_acc}}}$ | Resonance: $f_{res} = \dfrac{1}{2\pi \sqrt{C_{d\_acc} L_{d\_acc}}}$ |

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

According to a preferred embodiment of the invention, a one-dimensional accelerometer can be manufactured within the same process flow as required for a capacitive MEMS microphone. The one-dimensional accelerometer is positioned close to the capacitive MEMS microphone, without changing the physical size of the MEMS microphone die. Doing so, local process variations, which can influence critical parameters for sensitivity, such as stress of a layer, are optimized and no additional masks are necessary for the realization of the accompanying one-dimensional accelerometer.

Since the capacitive MEMS microphone according to the invention, which is optimized for measuring sound pressure, also has sensitivity to accelerations, a second, smaller, "microphone" with an additional mass on the membrane is added. This secondary "microphone" is more sensitive to accelerations and less sensitive to sound. Therefore, this secondary "microphone" is referred to as a one-dimensional accelerometer.

The parameters are:

$\Delta x/p$ the excursion of a membrane or mass due to a pressure p $\Delta x/p$ the excursion of a membrane or mass due to an acceleration a $a_d$ the size of the membrane or electrode. A square $a_d \times a_d$ membrane is assumed for simplicity $C_d$ the compliance of the membrane which is one over the spring constant $k^{-1}$ $\beta$ a compensation factor for the curvature of the membrane $L_d$ the mass of the membrane $C_{d\_acc}$ the compliance of the suspension of the mass in the accelerometer $L_{d\_acc}$ the mass of the proof mass in the accelerometer The sensitivity of an accelerometer for accelerations at low frequencies can be understood from a simple mass-spring system, as per following equations:

$$F = M \cdot a$$

$$F = k \cdot \Delta x$$

$$M \cdot a = k \cdot \Delta x$$

$$\frac{\Delta x}{a} = \frac{M}{k} \overset{def}{\longrightarrow} C_{d\_acc} L_{d\_acc}$$

where $C_d$ is the compliance of the membrane. When compensating the sensitivity for accelerations of the microphone, the following expression holds:

$$\frac{\Delta x}{a} = C_d L_d$$

Thus the accelerometer should have the same sensitivity. By designing $$C_d L_d = C_{d\_acc} L_{d\_acc}$$

The accelerometer and microphone will have the same sensitivity for accelerations, but also the same frequency response because the resonance frequencies are related in the same way.

This can be achieved by designing $C_d \gg C_{d\_acc}$ due to $L_d \ll L_{d\_acc}$. Fulfilling this requirement leads to a microphone with improved sensitivity for sound sensitivity with respect to the accelerometer. In addition, further reduction of the accelerometer's sensitivity to sound is achieved by making the size smaller.

These and other aspects of the invention will be apparent from and elucidated with reference to the embodiments described hereinafter.

FIGS. 1a-1g show an exemplary process of forming a micromachined microphone and an accelerometer from a wafer 1 according to a preferred embodiment of the invention. As it can be seen from FIG. 1a, the wafer 1 comprises a first layer 2, which is typically between 10 and 50 microns thick. According to the preferred embodiment of the invention, the wafer 1 is provided as a SOI wafer and the first layer 1 is provided as a Si layer. The wafer 1 comprises further a $SiO_2$ layer 2 and a Si layer 3, which is typically 650 microns thick. As known from the prior art, the first layer 1 is usually called the device layer, the $SiO_2$ layer 3 is usually called intermediate insulator layer, and the Si layer 4 is usually called bottom silicon layer.

Figure 1B:
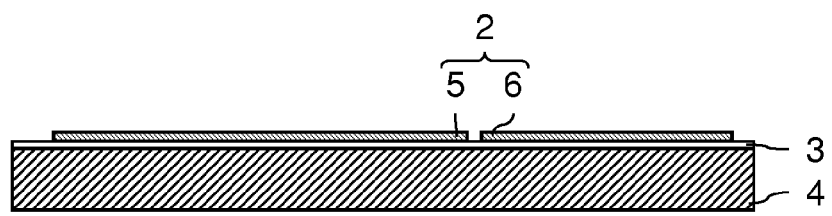

First, and as shown in FIG. 1b, the first layer 3 is patterned for creating a microphone layer 5 and an accelerometer layer 6. As can be seen later on in the process, the microphone layer 5 will form the microphone membrane and the accelerometer layer 6 will from the mass suspension of the accelerometer. It should be noted that the sensitivity is determined by the tension stress in the microphone membrane.

Figure 1C:
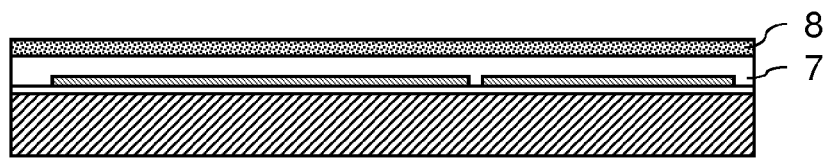

In FIG. 1c, an additional second layer 7, comprising an oxide or tetraalcoxysilane (TEOS), is added for covering the microphone layer 5 and the accelerometer layer 6. The second layer 7 is covered with a third layer 8, comprising polysilicon. As can be seen later on in the process, the third layer 8 will form the back plate for the microphone and/or for the accelerometer.

Figure 1D:
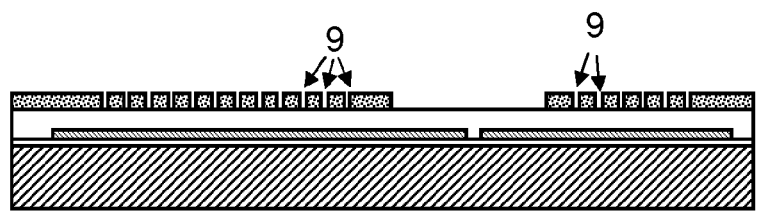

In FIG. 1d acoustic holes are edged in the back plate using a reactive ion edge forming trenches 9. As it can be seen further, the trench 9 covering an intersection between the microphone layer 5 and the accelerometer layer 6 is wider than the trenches 9 in the third layer 8 relatively covering the microphone layer 5 and/or the accelerometer layer 6.

Figure 1E:
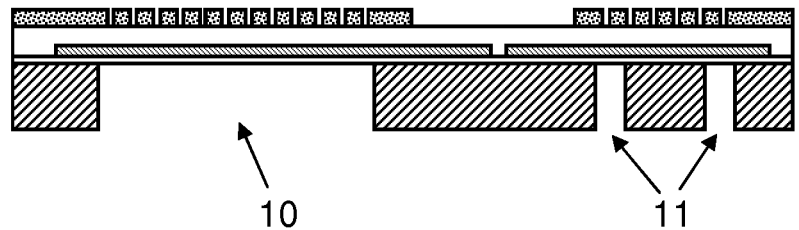

In FIG. 1e holes are edged through the whole wafer 1 by using deep reactive ion edging (DRIE) or alternatively wet anisotropic edging in potassium hydroxide (KOH) or tetramethylammonium hydroxide (TMAH). As it can be seen, a part 10 of the wafer 1 below the back side of the microphone layer 5 is removed, as well as wafer trenches 11 are formed in the wafer 1 below a back side of the accelerometer layer 6.

Figure 1F:
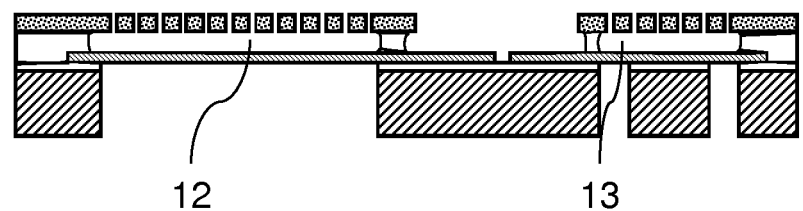

By using a sacrificial layer edge, as depicted in FIG. 1f, a part 12, 13 of the second layer 7 is removed through the plurality of trenches 9 formed in the third layer 8. In this way, the microphone layer 5 forming the microphone membrane is released from the back plate of the microphone formed by the trenches 9 in the third layer 8. As it can be seen further, a smaller structure of the accelerometer is released as well, but in this case as a suspended mass forming an accelerometer wafer mass.

Figure 1G:
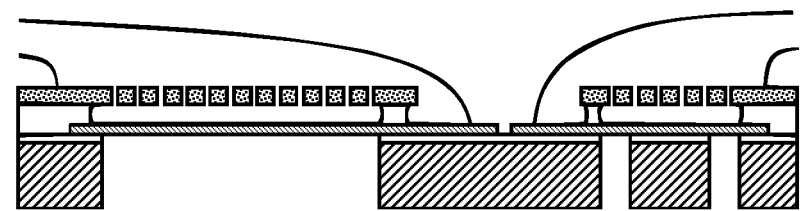

FIG. 1g shows the final micromachined microphone and accelerometer. According to the invention, the product of the mass of the microphone layer 5 with the compliance of the microphone layer 5 equals the product of the mass of the accelerometer layer 6 and the accelerometer wafer mass with the compliance of the accelerometer layer 6.

A further embodiment of the present invention is a useful application of the microphone and accelerometer as described in any of the above embodiments. A jolt to a phone, e.g. through textile or plastic material such as through a bag or pocket that contains the phone, can be detected and a signal generated. The signal generated by the acceleration of the phone can then be used to silence the phone, e.g. suppress the ring tone, suppress this sound only, set phone in quiet mode, answer call automatically.

This embodiment can be implemented in a variety of ways. In most cases a one dimensional accelerometer will be good enough for this application. Most people have their phone in their pocket, and the orientation of an accelerometer as described in any of the above embodiments guaranties optimal sensitivity when tapping straight on the surface of the phone.

In addition the phone can be adapted not to react to a single jolt but to a specific sequence of jolts. The phone may be adapted so that the user can program him/herself what type and rhythm of 'tapping' or 'slamming' should be recognized, and what the effect should be. Examples of desirable effects: 'Suppress this sound only' 'Set phone in quiet mode' 'Answer call', etc. . . . . .

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. Apparatus comprising:
   a wafer having a first layer,
   wherein the first layer is divided into a microphone layer and into an accelerometer layer, and
   wherein a part of the wafer below a back side of the microphone layer is removed and at least two wafer trenches are formed in the wafer below a back side of the accelerometer layer, and
   a front side of the microphone layer and a front side of the accelerometer layer are covered with a continuous second layer,
   wherein the second layer is covered with a third layer, and
   wherein a plurality of trenches is formed in the third layer and wherein a part of the second layer is removed through the plurality of trenches formed in the third layer.

2. Apparatus according to claim 1, wherein the microphone layer is adapted for generating a first electrical signal, wherein the first electrical signal is proportional to pressure applied to at least one of the microphone layer and the accelerometer layer, and wherein the accelerometer layer is adapted for generating a second electrical signal, wherein the second electrical signal is proportional to pressure applied to the at least one of the microphone layer and the accelerometer layer.

3. Apparatus according to claim 2, further comprising a subtraction module which is adapted for subtracting the second electrical signal from the first electrical signal.

4. Apparatus according to claim 1, wherein the trench in the third layer covering the intersection between the microphone layer and the accelerometer layer via the second layer is wider than the trenches in the third layer covering the microphone layer and/or the accelerometer layer via the second layer.

5. Apparatus according to claim 1, wherein the at least two wafer trenches in the wafer below the back side of the accelerometer layer form an accelerometer wafer mass, which is defined by the outmost trench on the one side of the wafer below the back side of the accelerometer layer and by the outmost trench on the other side of the wafer below the back side of the accelerometer layer.

6. Apparatus according to claim 1, wherein the product of the mass of the microphone layer with the compliance of the microphone layer equals the product of the mass of the accelerometer layer and the accelerometer wafer mass with the compliance of the accelerometer layer.

7. Apparatus according to claim 1, wherein the first layer is the device layer of a SOI wafer.

8. Apparatus according to claim 1, when used in a telephone.

9. Method of use of an apparatus having a micro machined microphone and accelerometer according to claim 8, comprising:
    detecting at least one jolt applied to the telephone, and
    executing one action comprising any of silencing the phone, suppressing a ring tone, suppressing sound only, setting phone in quiet mode, and answering call automatically.

10. Method using an apparatus with a micro machined microphone and accelerometer according to claim 1, comprising:
    detecting a first electrical signal between the microphone layer and the third layer relatively covering the microphone layer, wherein the first electrical signal is proportional to pressure applied to the microphone layer and/or to the accelerometer layer,
    detecting a second electrical signal between the accelerometer layer and the third layer relatively covering the accelerometer layer, wherein the second electrical signal is proportional to pressure applied to the microphone layer and/or to the accelerometer layer, and
    subtracting the second electrical signal from the first electrical signal.

11. Method for manufacturing the apparatus of claim 1, including micromachined microphone and an accelerometer from a wafer having a first layer, the method comprising the steps of:
    dividing the first layer into a microphone layer and into an accelerometer layer, covering a front side of the microphone layer and a front side of the accelerometer layer with a continuous second layer, covering the second layer with a third layer, forming a plurality of trenches in the third layer, removing a part of the wafer below a back side of the microphone layer, forming at least two wafer trenches in the wafer below a back side of the accelerometer layer, and removing a part of the second layer through the plurality of trenches formed in the third layer.

12. Method according to claim 11, wherein the trench in the third layer covering the intersection between the microphone layer and the accelerometer layer via the second layer is wider than the trenches in the third layer covering the microphone layer and/or the accelerometer layer via the second layer.

13. Method according to claim 11, wherein the at least two wafer trenches below the back side of the accelerometer layer form an accelerometer wafer mass, which is defined by the outmost trench on the one side of the wafer below the back side of the accelerometer layer and by the outmost trench on the other side of the wafer below the back side of the accelerometer layer.

14. Method according to claim 11, wherein the product of the mass of the microphone layer with the compliance of the microphone layer equals the product of the mass of the accelerometer layer and the accelerometer wafer mass with the compliance of the accelerometer layer.

15. Method according to claim 11, wherein the first layer is the device layer of a SOI wafer.

* * * * *